United States Patent [19]
Mori et al.

[11] Patent Number: 5,515,166
[45] Date of Patent: May 7, 1996

[54] OPTICAL FM CHARACTERISTICS MEASUREMENT APPARATUS FOR LASER DIODE

[75] Inventors: Hiroshi Mori, Ohizumi; Eiji Kimura, Gyoda, both of Japan

[73] Assignee: Advantest Corporation, Tokyo, Japan

[21] Appl. No.: 301,865

[22] Filed: Sep. 6, 1994

[30] Foreign Application Priority Data

Sep. 6, 1993 [JP] Japan .................................. 5-245932

[51] Int. Cl.⁶ .................................................. G01B 9/02
[52] U.S. Cl. .......................................... 356/345; 356/346
[58] Field of Search ...................................... 356/357, 345, 356/346, 358; 372/26, 27, 28, 38

[56] References Cited

U.S. PATENT DOCUMENTS 5,229,811  7/1993  Hattori et al. ........................... 355/50

Primary Examiner—Samuel A. Turner
Assistant Examiner—Robert Kim
Attorney, Agent, or Firm—Knobbe, Martens, Olson & Bear

[57] ABSTRACT

An optical FM characteristics measurement apparatus for measuring the light signal from a laser diode is capable of automatically and precisely determining a frequency discriminating point of the interferometer and maintain the discriminating point during the measurement. The measurement apparatus can distinguish an intensity modulation component from a frequency modulation component in the light signal from the laser diode, therefore, it can improve measurement accuracy and operation efficiency. The measurement apparatus has an interferometer control unit for controlling the interferometer used as an optical frequency discriminator, a processing unit for calculating a discriminating point using output of a photodiode and for storing its value, switches for detecting an increasing point or a decreasing point of the interferometer output based on the discriminating point, a switch for monitoring peak value of the interferometer in real time, and a network analyzer which is capable of analyzing the incoming signal in terms of amplitude and phase.

5 Claims, 6 Drawing Sheets

FIG. 2A
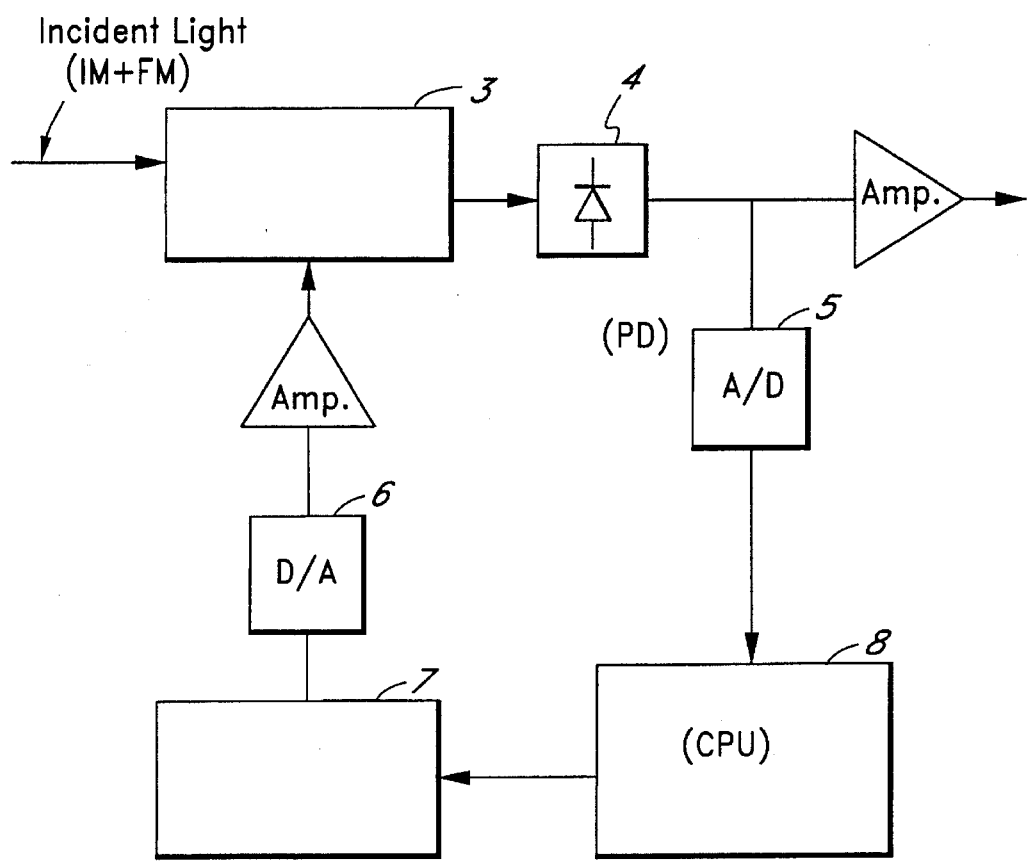
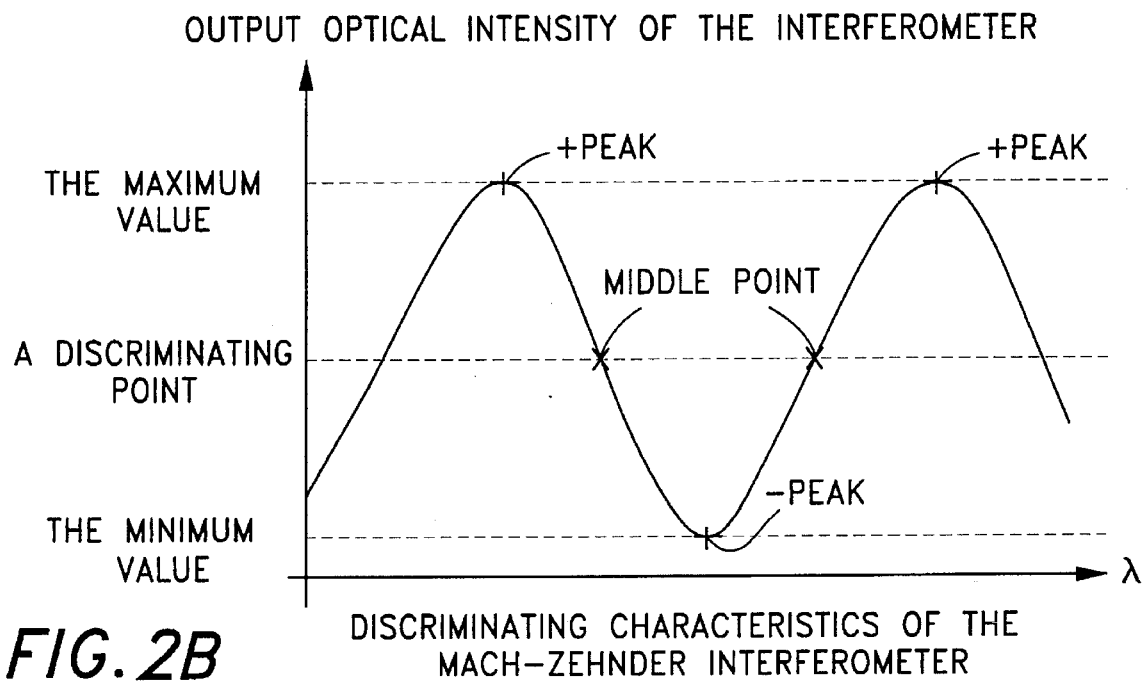
FIG. 2B

FM CHARACTERISTICS

DISCRIMINATING CHARACTERISTICS OF THE
MACH-ZEHNDER INTERFEROMETER

OPTICAL FM CHARACTERISTICS MEASUREMENT APPARATUS FOR LASER DIODE

BACKGROUND OF THE INVENTION

The present invention relates to an optical frequency modulation (FM) characteristics measurement apparatus for measuring optical characteristics of communication laser diodes.

The measurement apparatus of this invention is used for measuring optical FM characteristics of optical communication laser diodes. As shown in FIGS. 3A and 3B, varying laser diode (LD) currents shown in abscissas induce variations in the generated optical frequency (frequency modulation) and intensity (intensity modulation) shown in ordinates. An object of this measurement apparatus is to acquire a characteristics curve in which how frequency deviation (delta f) varies as a function of modulation frequency (fm) as illustrated in FIG. 3C. Other objects are to measure how frequency deviation varies as a function of a bias current of LD or other parameters. Until now, there is no measurement apparatus that satisfies these objects.

To acquire these characteristics curves, an engineer must fabricate by himself such a measurement apparatus. As a consequence, there are many problems in the conventional measurement, for example, (1) measuring the laser diode characteristics takes a long time because of manual operations, (2) fabricating the measuring apparatus requires hard and cumbersome work, (3) the measuring apparatus is not stable especially in setting a frequency discrimination point, and (4) as a result, measurement efficiency and accuracy are very low.

As noted above, there is so far no optical FM characteristics measurement apparatus which can easily measure an optical communication laser diode within a short period of time with high accuracy, high stability and ease of operation.

The prior art measurement apparatus which an engineer usually assembled in the past includes a Mach-Zehnder interferometer as a frequency discriminator which is formed of an piezo electric transducer and a polarization-maintaining optical fiber. This apparatus converts variation of optical frequency to variation of an optical intensity so that the resulted amplitude of the optical intensity can be converted to an electric signal. FIG. 4A shows a situation where a frequency modulation (FM) is converted to an intensity modulation (IM) by such an apparatus. As shown in FIG. 4A, according to the discrimination characteristics of the measurement apparatus, when the optical frequency varies, the output optical intensity varies accordingly. The output optical signal may be converted to an electrical signal by a photodiode (PD). Therefore, in this kind of apparatus, a frequency discriminating point must be set in the middle of the signal swing from the laser diode (LD) under test.

To measure LD characteristics accurately, the frequency discriminating point must be set in the middle of the signal and the discriminating point must be highly stable. In a prior art interferometer, the discriminating point is not stable enough because the discriminating point varies by, for example, a change in the angle of incident light or variation of ambient temperature, and etc.

FIG. 5A shows a block diagram of the prior art measurement apparatus having a Mach-Zehnder interferometer 3 as an optical frequency discriminator which is formed of an piezo electric transducer and a polarization-maintaining optical fiber. The apparatus also includes a voltage adjustment device 13 for adjusting the voltage level for the interferometer 3. The interferometer 3 in FIG. 5 is provided with an optical signal from a laser diode under test (not shown). The output signal from the interferometer is applied to a photo diode 4 wherein the optical intensity is converted to an electric signal to be analyzed by a test instrument such as a network analyzer 1. FIG. 5B shows a chart explanatory of the operation.

In FIG. 5A, the frequency discriminating point of the Mach-Zehnder interferometer 3 is set through the voltage adjustment device 13. In determining the frequency discriminating point, in the prior art, the maximum value $O_{max}$ of LD output is detected first by the photo diode 4, and then the discriminating point is set at the half value of the maximum value $O_{max}$ of the LD output as shown in FIG. 5B. Because operations are performed manually, to determine the frequency discriminating point will take a long time. Moreover, there are problems that output signal may have a large error because of the change of angle in the incident light to the Mach-Zehnder interferometer 3 and the discriminating point may not be maintained stable for a long time because of ambient temperature change.

Therefore, there is a need to provide an improved measurement apparatus which can easily measure an optical communication laser diode within a short time with high accuracy, high stability and ease of operation.

SUMMARY OF THE INVENTION

It is, therefore, an object of the present invention to provide an optical FM characteristics measurement apparatus in which the discriminating point of the Mach-Zehnder interferometer can be determined precisely with high stability.

It is another object of the present invention to provide an optical FM characteristics measurement apparatus which is capable of isolating a frequency modulation (FM) component from an intensity modulation (IM) component in the output signal from the laser diode under test.

It is a further object of the present invention to provide an optical FM characteristics measurement apparatus which is capable of improving measurement accuracy and operation efficiency by using predetermined switches.

According to the present invention, the measurement apparatus has an interferometer control unit for controlling an interferometer used as an optical frequency discriminator for demodulating the output signal from a laser diode under test, a processing unit for calculating a frequency discriminating point using output of a photodiode and for storing its value, switches for setting an increasing point or a decreasing point of the interferometer output based on the discriminating point, and an IM monitor switch for monitoring a peak value of the interferometer in real time. The measurement apparatus of the present invention also includes a network analyzer for analyzing both amplitude and phase of the output signal from the interferometer.

Because of such an arrangement, the discriminating point can be set accurately in a short period of time by detecting the maximum level and the minimum level of the output signal from the interferometer and determining the center of the two levels as the discriminating point. The measurement apparatus of the present invention constantly monitor the discriminating point of the interferometer output and compares the calculated discriminating point. If there is a difference between the two, the measurement apparatus controls the interferometer so that the discriminating point in the interferometer to be the same as the calculated discriminating point.

Based on such an accurate discriminating point, phase control for isolating the IM component from the FM component in the optical signal from the laser diode under test can be easily made with an assistance of the network analyzer. These operations are triggered by push switches provided to the apparatus. Therefore, FM measurement with high stability, operability and throughput is possible in the measurement apparatus. Moreover, because of the IM monitor switch, a user can quickly adjust the laser diode to be tested and its connection to the measurement apparatus by monitoring the intensity level of the demodulated signal.

BRIEF DESCRIPTION OF THE DRAWINGS

FIG. 2A is a block diagram illustrating a control mechanism of the Mach-Zehnder interferometer which is a principal part of the present invention.

FIG. 2B is a chart for explaining a frequency discrimination characteristics of the Mach-Zehnder interferometer;

DETAILED DESCRIPTION OF THE PREFERRED EMBODIMENT

Figure 1:
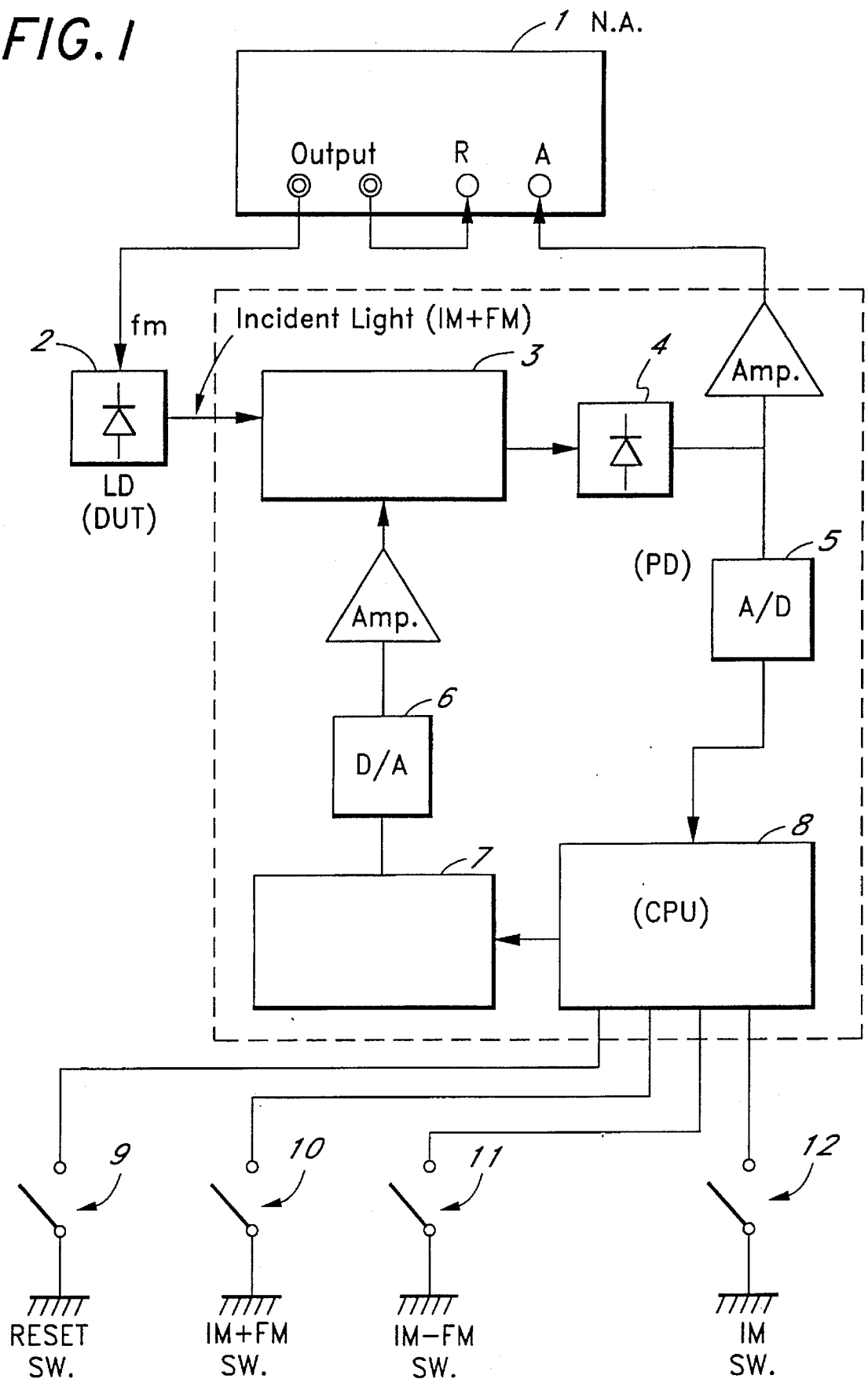
FIG. 1 is a block diagram illustrating an embodiment of the present invention.
Figure 5A:
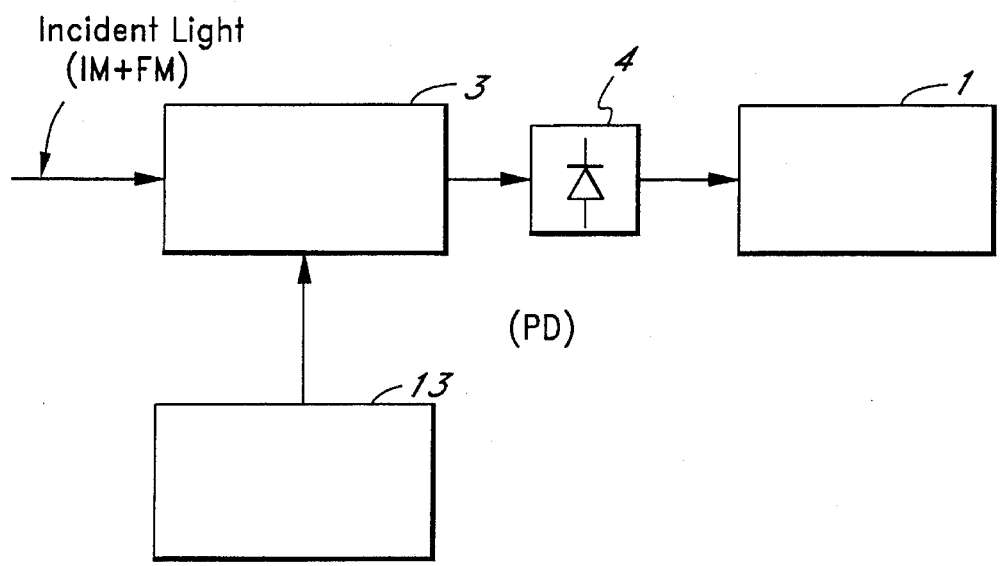
FIG. 5A is a block diagram illustrating a prior art control mechanism of the Mach-Zehnder interferometer.
Figure 5B:
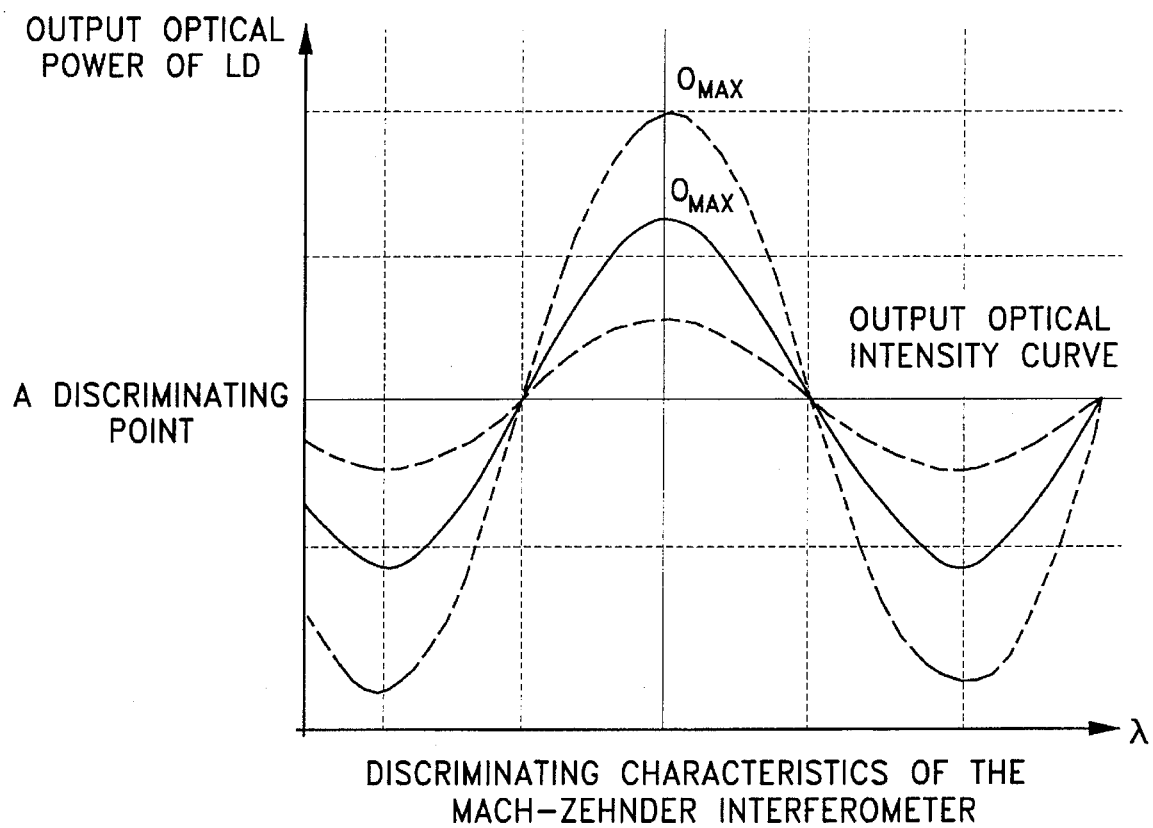
FIG. 5B is a graphic view for explaining a prior art process for setting a frequency discriminating point in the measurement apparatus of FIG. 5A.

FIG. 1 illustrates, in a block diagram form, an embodiment of the optical FM characteristics measurement apparatus of the present invention, in which like parts corresponding to those in FIG. 5A are identified by the same reference numerals.

In FIG. 1, a laser diode 2 to be tested is connected to the input of an interferometer 3 so that the incident light from the laser diode 2 is given to the interferometer 3. In this example, the laser diode 2 is provided with a frequency modulation signal $f_m$ from a network analyzer 1. The interferometer 3 outputs a demodulated signal to a photo diode 4 which converts the demodulated light signal to an electric signal. The output of the photo diode 4 is supplied to an input terminal A of the network analyzer through an amplifier. The output of the photo diode 4 is also supplied to an A/D convertor 5 wherein the analog signal is converted to a digital signal. The network analyzer 1 can measure both amplitude and phase of an incoming signal as is well known in the art.

Figure 4A:
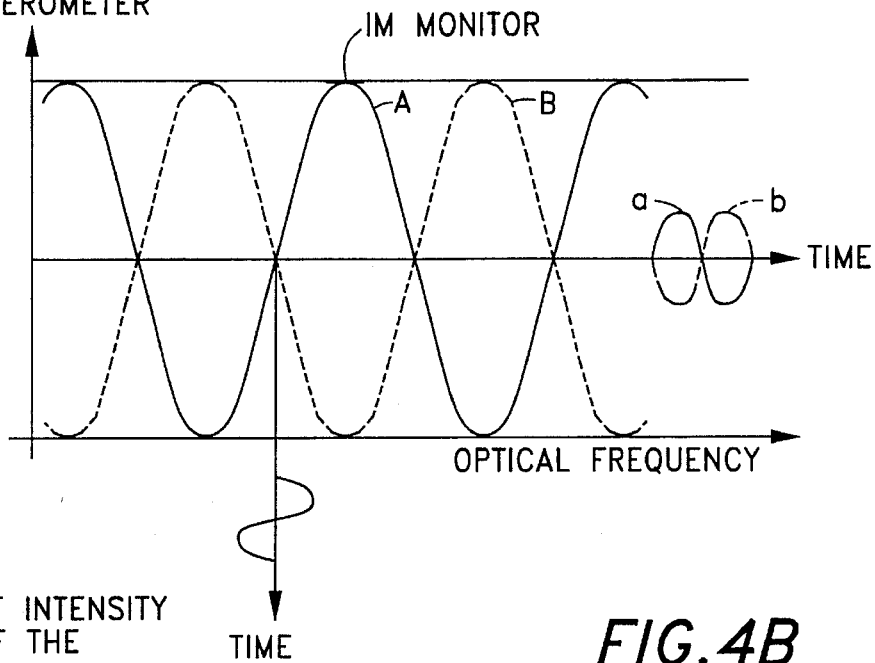
FIG. 4A is a graphic view showing two demodulation curves of the interferometer output which are half wavelength apart from each other.

The digital signal from the A/D convertor 5 is monitored by a processing unit 8 which calculates a frequency discriminating point and store the voltage value of the discriminating point in a memory. The processing unit 8 is provided with switches 9–12 for setting the functions of the measurement apparatus. An interferometer control unit 7 is provided to receive an instruction from the processing unit 8 and to control the interferometer through a D/A convertor 6 and an amplifier. The D/A convertor 6 converts the control signal from the interferometer control unit 7 and supplies the analog signal to the interferometer 3 through the amplifier. An example of structure in the interferometer is shown in FIG. 4C.

As shown in FIG. 1, having the interferometer control unit 7 and the numeric processing unit 8, the measurement apparatus of the invention can acquire a frequency discriminating point automatically in a short period of time by using easy-operation switches. Further, the measurement apparatus of the present invention can distinguish an intensity modulation component and a frequency modulation component contained in the light signal from the laser diode 2. To perform these functions, the measurement apparatus has four switches, a reset switch 9, an "IM+FM" switch 10, an "IM–FM" switch 11, and an IM monitor switch 12.

In operation, the reset switch 9 is pressed to make the processing unit 8 instruct the control unit 7 to sweep the interferometer 3. The control unit 7 controls the D/A converter 6 so that the output of the D/A convertor 6 sweeps linearly from a low voltage level to a high voltage level. As a result, the demodulated signal from the interferometer 3 shows a plus peak and a minus peak which are provided to the processing unit 8 through the photo diode 4 and the A/D convertor 5. The processing unit 8 detects the plus peak and the minus peak and also calculates the middle point of the two peaks as a discriminating point and stores the discriminating point in the memory.

The "IM+FM" switch 10 and the "IM–FM" switch 11 are used to differentiate the frequency modulation component and the intensity modulation component in the incident light from the laser diode 2 under test. The "IM+FM" switch 10 is pressed to make the processing unit 7 instruct the control unit 7 to change the voltage from the D/A converter 6. The demodulated output from the interferometer 3 is monitored and then the interferometer output is locked at the point where the demodulated output increases with the increase of the voltage supplied to the interferometer 3. The "IM–FM" switch 11 is pressed to make the processing unit 8 instruct the control unit 7 to change the voltage from the D/A converter 6. The demodulated output from the interferometer 3 is monitored and then the interferometer output is locked at the point where the demodulated output decreases with the increase of the voltage supplied to the interferometer 3.

Additionally, the IM monitor switch 12 is used to monitor the peak intensity of the incident light from the laser diode 2. The IM monitor switch 12 is pressed to make the processing unit 8 instruct the control unit 7 to change the voltage from the D/A converter 6. In this setting, the discriminating point in the interferometer is set to the peak point on the interferometer curve so that the peak level of the incident light from the laser diode 2 can easily be monitored by the measurement apparatus.

Figure 4B:
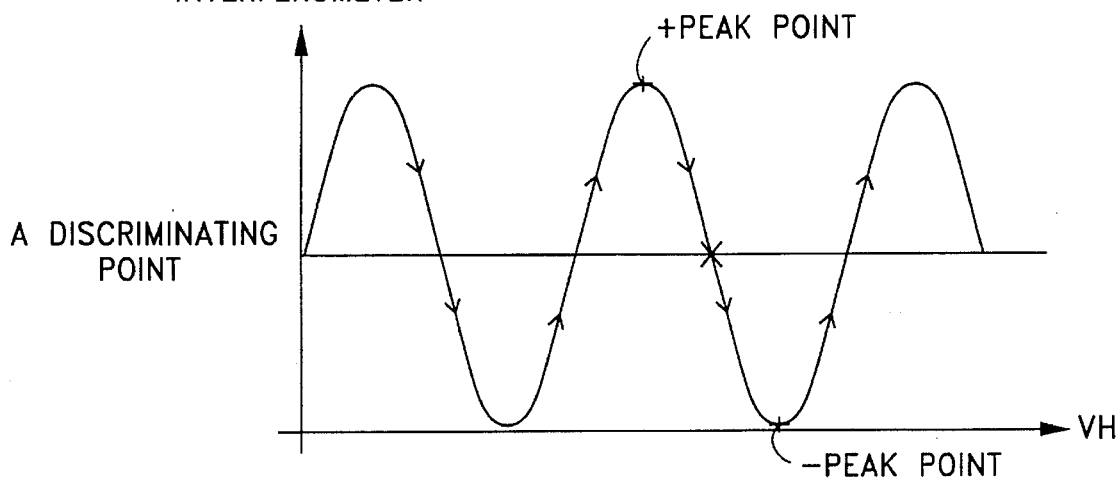
FIG. 4B is a graphic view illustrating an output signal which is acquired by sweeping a high voltage to the Mach-Zehnder interferometer.
Figure 4C:
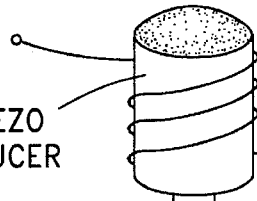
FIG. 4C is a schematic diagram showing a basic structure of the Mach-Zehnder interferometer using a piezo electric transducer and an optical fiber.
Figure 4C:
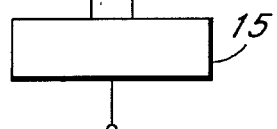

As shown in FIG. 4B, the frequency discriminating point can be determined at the midpoint of the maximum and minimum values of the interferometer output. Brief explanation for determining the discriminating point is given below with reference to FIGS. 1 and 4B and 4C. In the preferred embodiment, the interferometer 3 is constructed by a polarization-maintaining optical fiber 16 and a cylindrical piezo electric transducer 14 as principal parts as shown in FIG. 4C. Adding high voltage from a voltage source 15 to the cylindrical piezo electric transducer 14 makes the transducer 14 expand or shrink in volume. As a consequence, the refractive index of the optical fiber 16 coiled along outer surface may change since the length of the optical fiber 16 varies.

As a result, optical intensity of the interferometer 3 output can be controlled as shown as interferometer curves in FIG. 4B. Therefore, by sweeping the high voltage from the voltage source 15 to detect a plus peak and a minus peak, the midpoint between the two peaks can be determined as the frequency discriminating point. Because the processing unit 8 stores the detected value for the discriminating point and controls the interferometer 3 to maintain the discriminating point with the use of a feedback loop, the stable and accurate measurement can be achieved. Moreover, the selection of the above operations can be made by a predetermined switch, which realizes an improved efficiency and ease of operation in the FM measurement.

Figure 3A:
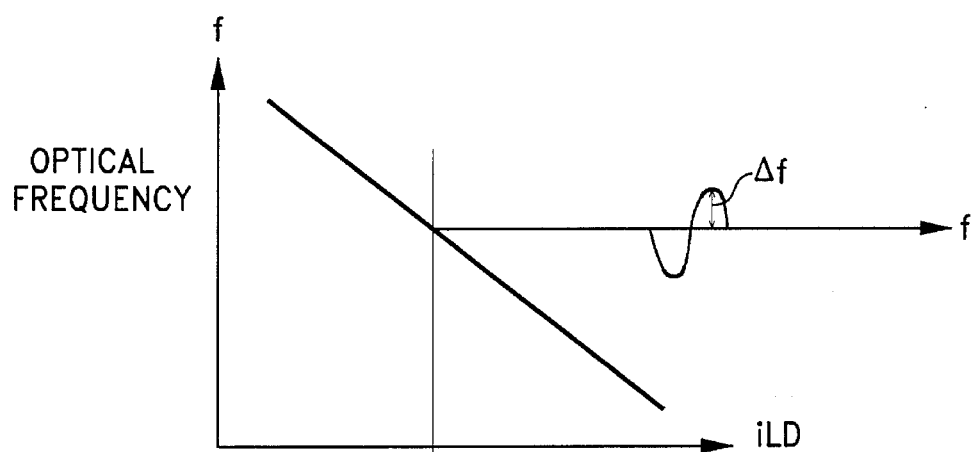
FIG. 3A is a graphic view for explaining the principle of frequency modulation technique of a laser diode.
Figure 3B:
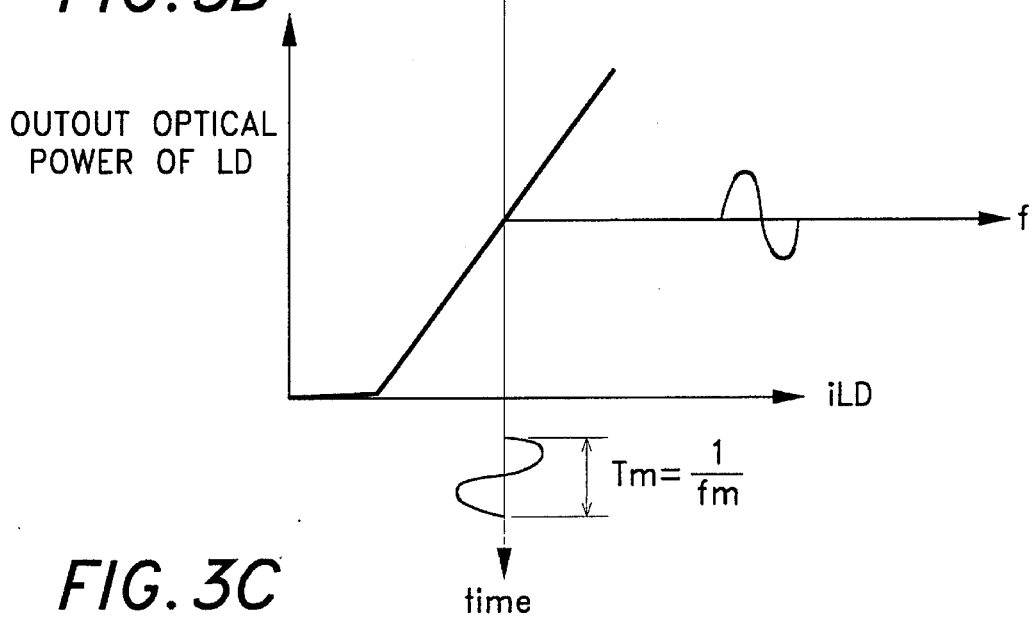
FIG. 3B is a graphic view for explaining the principle of intensity modulation technique of a laser diode.
Figure 3C:
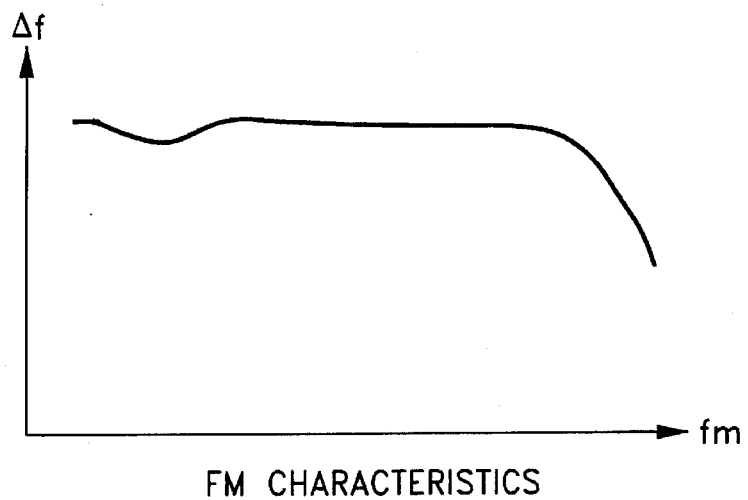
FIG. 3C is a graphic view showing a typical characteristics curve which the FM measurement apparatus is intended to acquire.

Next, a description of how to acquire accurate frequency modulation characteristics of a laser diode is given with reference to FIGS. 1, 3 and 4. As shown in FIGS. 3A and 3B, the oscillation frequency of the laser diode 2 is modulated by a bias current or the frequency modulation (FM) signal $f_m$ from a network analyzer 1. As shown in FIG. 3B, the bias current also changes the output optical power of laser diode 2, which is an intensity modulation (IM). Therefore, the output signal of the laser diode 2 provided to the interferometer 3 includes both the FM component and the IM component.

To measure the FM characteristics accurately, the FM component and the IM component must be separated, and the IM component must be removed. As shown in FIGS. 4A and 4B, in the present invention, two interferometer curves are generated by changing the analog voltage to the interferometer 3. The interferometer curve A is generated by controlling the interferometer 3 such that the demodulated signal level in the output of the interferometer at the discriminating point increases with the increase of the analog voltage supplied to the interferometer 3. As noted above, this detection of curve A will be made by the use of the "IM+FM" switch 10. Similarly, the interferometer curve B is generated by controlling the interferometer 3 such that the demodulated signal level in the output of the interferometer at the discriminating point decreases with the increase of the analog voltage supplied to the interferometer 3. As noted above, this detection of curve B will be made by the use of the "IM−FM" switch 10.

Because the interferometer curve A is apart from the interferometer curve B with a half wavelength, the phase relation of demodulated signals is inverted. In contrast, the IM component is in-phase since the amplitudes of the curves A and B are the same as shown in FIG. 4A. Therefore, the following relationship is established between the curve A and the curve B.

In the demodulation signal obtained in the curve A, the signal inputted to the network analyzer 1 (VA) includes both the IM component and the FM component, i.e., IM+FM. In the demodulation signal obtained in the curve B, the signal inputted to the network analyzer 1 (VB) includes the difference between the IM component and the FM component, i.e., IM−FM.

Therefore, the relationship between the signals VA and VB can be expressed as VA−VB=2FM, and VA+VB=2IM. As a result, if either of the signals VA or VB is measured first by the network analyzer 1 and stored therein the result, and then the other signal is measured by the network analyzer 1 and subtracted from or added with each other, the IM component and the FM component in the demodulated signal can be separated.

According to the present invention, the IM monitor switch 12 is also provided as shown in FIG. 1. The function of this switch is to measure peak value of output optical intensity. Because sensitivity to the FM component becomes to zero at peak value, the IM component can be monitored in real time without calculation. Therefore, this function is useful in, for example, correcting the optical axis of laser beam of the laser diode 2 or monitoring the output level of the laser diode 2.

Figure 6:
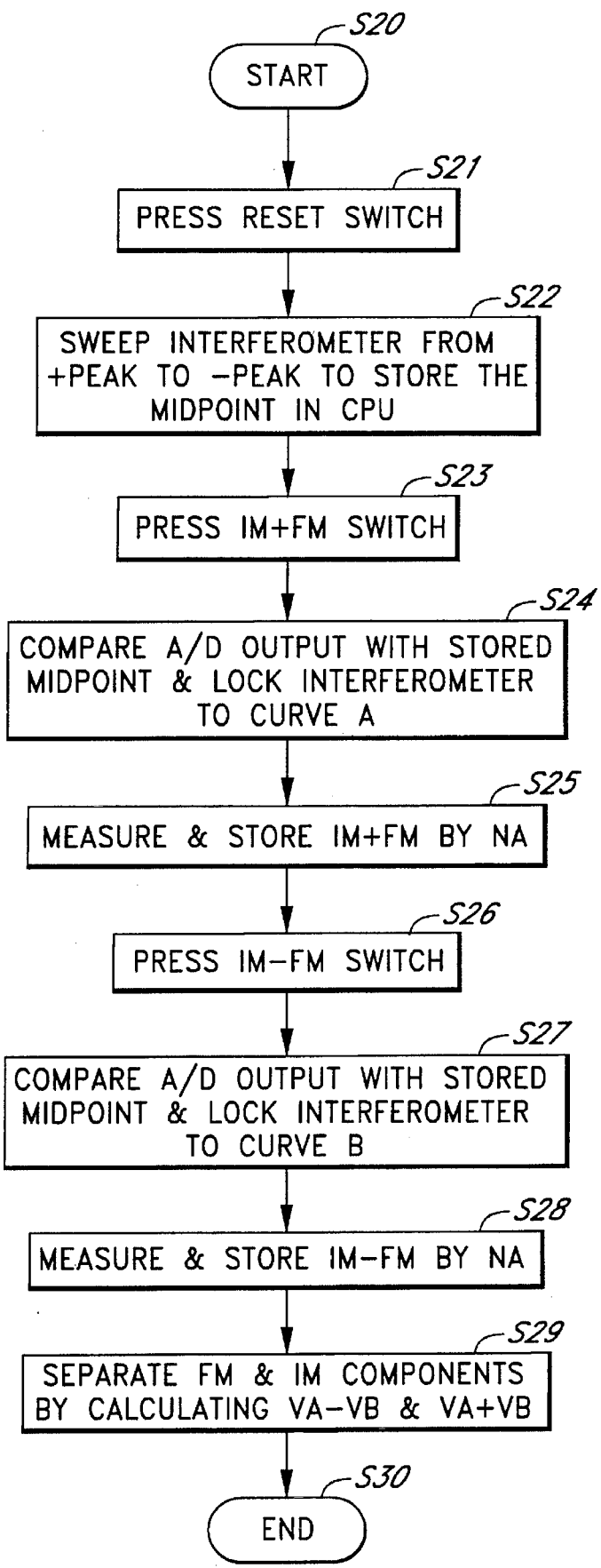
FIG. 6 is a flow chart showing a control routine for FM measurement in accordance with the FM measurement apparatus of the present invention.

FIG. 6 is a flow chart showing the control routine of the FM modulation measurement in accordance with the measurement apparatus of the present invention. As soon as the operation starts at the step S20, the process advances to the step S21 wherein a user presses the reset switch 9. In the step S22, the D/A convertor 6 drives the interferometer 3 to detect the plus peak and the minus peak in the interferometer curve. The processing unit 8 calculates the center level between the plus peak and the minus peak and stores the center level in the memory as the frequency discriminating point.

In the next step S23, the "IM+FM" switch 10 is pressed to change the voltage from the D/A converter 6. In the step S24, the demodulated output from the interferometer 3 is monitored and compared with the stored discriminating point. Then the interferometer output is locked at the point where the demodulated output increases with the increase of the voltage supplied to the interferometer 3. In the step S25, the network analyzer 1 measures the signal VA=IM+FM obtained under the setting of the step S24 and stores the measured results therein.

In the next step S26, the "IM−FM" switch 11 is pressed to change the voltage from the D/A converter 6. In the step S27, the demodulated output from the interferometer 3 is monitored and compared with the stored discriminating point. Then the interferometer output is locked at the point where the demodulated output decreases with the increase of the voltage supplied to the interferometer 3. In the step S28, the network analyzer 1 measures the signal VB=IM−FM obtained under the setting of the step S27 and stores the measured results therein. In the step S29, the IM component and the FM component are separated from each other by performing the calculation VA−VB and VA+VB in the network analyzer 1. The process for measuring the FM characteristics ends at the step S30.

The present invention described above has remarkable effects as follows.

In the prior art measurement apparatus, the adjustment of the interferometer 3 as an optical frequency discriminator is performed manually and the discriminating point is fixed at the middle of the maximum LD output. In contrast, in the measurement apparatus of the invention, a discriminating point can be determined accurately in a short period of time and the discriminating point is always stable because of the measurement apparatus controls the interferometer to maintain the determined discriminating point.

The phase control for separating the IM component and the FM component contained in the light signal from the laser diode under test can be performed precisely by utilizing two interferometer curves and the network analyzer. In addition, the above operations are triggered by the predetermined push switches, which increases the measurement efficiency and throughput. Moreover, because of the IM monitor switch 12, the user can easily switch from the FM measurement to the peak intensity monitoring for adjusting the optical axis of laser beam or measuring the input power level.

It will be apparent that many modifications and variations may be effected without departing from the scope of the novel concepts of the present invention.

What is claimed is:

1. An optical FM characteristics measurement apparatus of a laser diode, comprising:

an interferometer for demodulating an input light signal from the laser diode to be tested;

an interferometer control unit for controlling said interferometer, said control unit controlling a voltage level supplied to said interferometer;

a processing unit for controlling the overall operational procedure of the measurement apparatus, said processing unit detecting the peak value of the demodulated signal from said interferometer and calculating a discriminating point for said interferometer, said processing unit storing said discriminating point and comparing the demodulated signal from said interferometer with said discriminating point;

a network analyzer for analyzing said demodulated signal from said interferometer, said network analyzer being able to measure both amplitude and phase characteristics of said demodulated signal;

means for separating an intensity modulation component and a frequency modulation component in said light signal from said laser diode under test by calculating two outputs of inverted phases derived from said interferometer;

wherein said calculating process including that said two outputs of inverted phases being generated by locking said interferometer at the point where said demodulated signal increases with the increase of said voltage supplied to said interferometer, and then locking said interferometer at the point where said demodulated signal decreases with the increase of said voltage supplied to said interferometer.

2. An optical FM characteristics measurement apparatus as defined in claim 1 further includes switches for instructing the measurement apparatus to calculate a discriminating point, to store said discriminating point, and to detect an increasing point and a decreasing point of said interferometer output based on said discriminating point.

3. An optical FM characteristics measurement apparatus as defined in claim 1 further includes a switch for instructing the measurement apparatus to monitor a peak intensity of said laser diode from said interferometer output in real time.

4. An optical FM characteristics measurement apparatus as defined in claim 1, wherein said interferometer is formed of a piezo electric transducer and an optical fiber.

5. An optical FM characteristics measurement apparatus as defined in claim 1, wherein said demodulated signal from said interferometer is detected by a photo diode for converting said demodulated signal to an electric signal.

\* \* \* \* \*